(12) United States Patent
Zhao et al.

(10) Patent No.: US 11,747,370 B2
(45) Date of Patent: Sep. 5, 2023

(54) FIBER-OPTIC CURRENT TRANSFORMER BASED ON NITROGEN-VACANCY (NV) CENTERS IN DIAMOND, AND MEASUREMENT METHOD

(71) Applicant: ANHUI GUOSHENG QUANTUM TECHNOLOGY CO., LTD., Hefei (CN)

(72) Inventors: Bowen Zhao, Hefei (CN); Shaochun Zhang, Hefei (CN)

(73) Assignee: ANHUI GUOSHENG QUANTUM TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 17/744,070

(22) Filed: May 13, 2022

(65) Prior Publication Data

US 2023/0160930 A1     May 25, 2023

(30) Foreign Application Priority Data

Nov. 22, 2021    (CN) .......................... 202110994982.0

(51) Int. Cl.
    *G01R 15/24*     (2006.01)
    *G01R 19/00*     (2006.01)

(52) U.S. Cl.
    CPC ....... *G01R 15/247* (2013.01); *G01R 19/0092* (2013.01)

(58) Field of Classification Search
    CPC .......................... G01R 15/247; G01R 19/0092
    See application file for complete search history.

(56) References Cited

U.S. PATENT DOCUMENTS

| 2016/0018269 | A1* | 1/2016 | Maurer | G01K 11/20 374/121 |
| 2019/0178959 | A1* | 6/2019 | Barry | G01R 33/12 |
| 2021/0396786 | A1* | 12/2021 | Palacios Laloy | G01R 19/0092 |
| 2022/0011249 | A1* | 1/2022 | Yao | G01R 33/46 |

\* cited by examiner

*Primary Examiner* — Dominic E Hawkins
(74) *Attorney, Agent, or Firm* — Jacob M. Ward; Ward Law Office LLC

(57) ABSTRACT

The present disclosure relates to the technical field of current sensors, and provides a fiber-optic current transformer based on nitrogen-vacancy (NV) centers in diamond, and a measurement method. The fiber-optic current transformer based on NV centers in diamond includes a device for laser light excitation and reflected light reception and analysis, a diamond NV center probe, a magnetic concentrator, and a microwave excitation device. The fiber-optic current transformer based on NV centers in diamond includes three measurement methods: an all-optical measurement method, a non-all-optical measurement method, and a measurement method combining the all-optical measurement method and the non-all-optical measurement method. A sensor in the present disclosure has advantages of a simple structure, strong practicability, resistance to external interference, and strong robustness.

16 Claims, 5 Drawing Sheets

FIBER-OPTIC CURRENT TRANSFORMER BASED ON NITROGEN-VACANCY (NV) CENTERS IN DIAMOND, AND MEASUREMENT METHOD

CROSS-REFERENCE TO RELATED APPLICATIONS

This application claims priority to Chinese Patent Application No. 202110994982.0, filed Nov. 22, 2021. The entire disclosure of the above application is hereby incorporated herein by reference.

TECHNICAL FIELD

The present disclosure relates to the technical field of current sensors, and specifically, to a fiber-optic current transformer based on nitrogen-vacancy (NV) centers in diamond, and a measurement method.

BACKGROUND

There are various detection methods for current sensing. For example, an electrified conductor makes a mechanical movement in a magnetic field, and then an original mechanical ammeter emerges, and a thermocouple instrument is provided to convert a current into heat. However, these measurement instruments or sensors perform series contact detection on a measured object, which changes a working status of a circuit or an electrified device, making it difficult to accurately detect a current in a circuit or an electrified conductor that operates normally. In order to resolve this problem, non-contact current measurement is proposed, that is, current measurement is converted into magnetic field measurement by using a magnetic effect of the current, and finally accuracy of the current measurement is converted into accuracy of the magnetic field measurement.

For the magnetic field measurement, compared with traditional magnetic field sensing based on electrical principles such as the Hall effect, fiber-optic magnetic field sensing has been developed only in recent decades. So far, there are mainly two kinds of magnetic field detection methods based on an optical fiber. One is to use a medium to make light and a magnetic field generate a magneto-optical rotation effect, and then detect a change of a polarization property of polarized light. The other is to use magnetic-field sensitive materials such as a magnetostrictive material and a magnetic fluid. Morphological characteristics of these materials change with the magnetic field, and a displacement change is measured by using a fiber-optic interference system. Although these two methods have been researched at home and abroad, and considerable measurement sensitivity has been achieved, there are still many problems. For example, performance of a sensor depends too much on sensitivity of a material to the magnetic field and physical characteristics (length and shape) of the optical fiber, such that stability and detection accuracy of the sensor in a use process cannot be well guaranteed. These factors ultimately limit the development of a magnetic field sensor based on the optical fiber.

In recent years, the research on NV centers in diamond has opened up unlimited possibilities in the field of quantum sensing. Especially in the magnetic field measurement, detection methods dominated by optically detected magnetic resonance (ODMR) have been developed, and detection sensitivity lower than nT has been realized. However, all these technologies are based on a confocal optical path system, and cannot be generalized easily because of their complex structures and high costs.

Based on this, the present disclosure designs a fiber-optic current transformer based on NV centers in diamond, and a measurement method to resolve the above problems.

SUMMARY

The present disclosure provides a fiber-optic current transformer based on NV centers in diamond, and a measurement method. The fiber-optic current transformer based on NV centers in diamond couples an optical fiber and NV centers in diamond together as a probe, and realizes high-sensitivity current sensing by using the probe. A correlation between a detection process of the probe and a material property and a shape of the optical fiber can be ignored, which effectively prevents a physical state of the optical fiber affecting a measurement result. Measurement sensitivity of the probe only depends on intensity of excitation light, concentrations of the NV centers in the diamond, and collection efficiency of fluorescence, thereby greatly widening space for improving the measurement sensitivity. In addition, the present disclosure combines magnetizers with different magnetic concentration capabilities, and can accurately measure currents of mA to kA levels by using the fiber-optic current transformer. Moreover, the present disclosure has a simple structure and a low cost, and can be easily generalized.

To achieve the above objective, the present disclosure provides the following technical solutions.

A fiber-optic current transformer based on NV centers in diamond includes a device for laser light excitation and reflected light reception and analysis, a diamond NV center probe, a magnetic concentrator, and a microwave excitation device, where the device for laser light excitation and reflected light reception and analysis is configured to excite a laser beam to the diamond NV center probe, screen a mixed laser beam reflected by the diamond NV center probe, and perform data analysis on retained fluorescence reflected by NV centers;

the diamond NV center probe is disposed at an original laser beam output terminal of the device for laser light excitation and reflected light reception and analysis, and configured to receive and reflect the original laser beam to generate the mixed laser beam;

the magnetic concentrator is disposed in a periphery of a to-be-measured electrified conductor, and configured to increase a magnetic field in the periphery of the to-be-measured electrified conductor; and a microwave excitation part of the microwave excitation device surrounds a periphery of the diamond NV center probe or a periphery of the magnetic concentrator to perform microwave frequency sweeping.

Preferably, the device for laser light excitation and reflected light reception and analysis includes a laser, a reflector, a dichroic mirror, a fiber-optic coupler, a filter, an optical fiber, a photodetector, a fluorescence analysis processor, and a computer, where the laser emits the original laser beam towards the reflector, and the reflected original laser beam is reflected secondarily by the dichroic mirror, enters the optical fiber after being coupled by one fiber-optic coupler, and finally enters the diamond NV center probe; the diamond NV center probe generates reflected fluorescence after being irradiated by the original laser beam, and the reflected fluorescence and the original laser beam form the mixed laser beam; the mixed laser beam returns along the optical fiber and is filtered by the dichroic mirror, the reflected fluorescence in the mixed laser beam penetrates the dichroic mirror, and the reflected fluorescence penetrating the dichroic mirror undergoes secondary filtering by the filter to obtain detection fluorescence; the obtained detection fluorescence is coupled by another fiber-optic coupler and enters the optical fiber connected to the photodetector; and the photodetector detects the detection fluorescence and transmits detection data to the fluorescence analysis processor for signal analysis and processing.

Preferably, the diamond NV center probe includes diamond containing high-concentration NV centers, and the diamond is disposed in the middle of an end face of the optical fiber through welding or bonding.

Preferably, the photodetector is an avalanche diode or a photodiode, and the fluorescence analysis processor is a phase-locked amplifier.

Preferably, the microwave excitation device includes a microwave antenna and a microwave source, where the microwave antenna is a coil surrounding the periphery of the diamond NV center probe or the periphery of the magnetic concentrator; and the microwave source generates an amplitude modulated microwave that can modulate the fluorescence emitted by the NV centers, the fluorescence is received by the photodetector and finally used as an input signal of the fluorescence analysis processor, and a radio frequency (RF) signal output by the microwave source is used as a reference signal of the fluorescence analysis processor.

A measurement method for the fiber-optic current transformer based on NV centers in diamond includes an all-optical measurement method, a non-all-optical measurement method, and a measurement method combining the all-optical measurement method and the non-all-optical measurement method.

1) The all-Optical Measurement Method Includes:

when measuring a large-current electrified conductor, placing the magnetic concentrator in a periphery of the to-be-measured electrified conductor; placing the diamond NV center probe in a magnetic-concentration air gap of the magnetic concentrator, and making a lattice orientation [100] of the diamond parallel to a magnetic field in the magnetic-concentration air gap; emitting, by the device for laser light excitation and reflected light reception and analysis, an original laser beam, and using the original laser light to irradiate the diamond; returning, to the device for laser light excitation and reflected light reception and analysis, fluorescence reflected by the diamond; and estimating a size of an external magnetic field by analyzing the reflected fluorescence, and then calculating a current in the conductor.

In the non-all-optical measurement method, a principle of an optically detected magnetic resonance (ODMR) method is as follows:

considering that a magnetic field B and a microwave $\Omega \cos(2\pi ft)$ that interact with each other exist in peripheries of the NV centers, impact of internal stress of an ensemble center is ignored, and ground-state Hamiltonians of the NV centers are:

$$H = D(t)S_z^2 + B_z S_z + B_x S_x + B_y S_y + \Omega \cos(2\pi ft) S_x \quad (1)$$

where Z represents an axial direction of each of the NV centers, $B_x$, $B_y$, and $B_z$ represent projection sizes of a magnetic field vector $\vec{B}$ in x, y, and z directions respectively, $S_x$, $S_y$, and $S_z$ represent projection sizes of a spin operator $\vec{S}$ in the x, y, and z directions respectively, $\Omega$ represents a value of microwave power, f represents a microwave frequency, and D(T) represents a value of a zero-field splitting of each of the NV centers at temperature T;

during detection, the lattice orientation [100] of the diamond is made parallel to the applied magnetic field B, and in this case, an ODMR spectrum can be obtained based on a decoherence principle of the NV centers and a Lindblad master equation, and satisfies the following relational expression:

$$S_{cw}(f) = 1 - \frac{C\gamma}{(f-f_-)^2 + \gamma^2} - \frac{C\gamma}{(f-f_+)^2 + \gamma^2} \quad (2)$$

where C and $\gamma$ represent a contrast and a full width at half maximum (FWHM) of a spectral line respectively, f− represents a center frequency of a left peak of the ODMR spectrum, f+ represents a center frequency of a right peak of the ODMR spectrum, and f represents a center frequency of a valley between two peaks of the ODMR spectrum; and a size of the external magnetic field B can be speculated by measuring a resonance frequency corresponding to the two peaks in the ODMR spectrum, and then the current in the electrified conductor is calculated.

2) The Non-all-Optical Measurement Method Includes:

when measuring a small-current electrified conductor, placing the magnetic concentrator in a periphery of the to-be-measured electrified conductor; placing the diamond NV center probe in the magnetic-concentration air gap of the magnetic concentrator, and making the lattice orientation [100] of the diamond parallel to the magnetic field in the magnetic-concentration air gap; emitting, by the device for laser light excitation and reflected light reception and analysis, an original laser beam, and using the original laser light to irradiate the diamond; starting the microwave source at the same time to generate a modulated microwave, and using an RF with a same modulation frequency as a reference signal of the fluorescence analysis processor; performing, by using the modulated microwave, frequency sweeping on fluorescence emitted by the NV centers, to obtain an ODMR spectrum; and accurately calculating a size of an external magnetic field by using the ODMR method, and then calculating a current in the electrified conductor.

A Principle of the all-Optical Measurement Method is as Follows:

considering that there is no magnetic field in peripheries of the NV centers, a transition rate between a ground state and an excited state of a system satisfies a transition rate equation for an electron energy level;

when there is a magnetic field in the peripheries of the NV centers, and if a direction of the magnetic field is not parallel to axial directions of the NV centers, the external magnetic field changes energy-level eigenstates of the NV centers, so as to change a transition rate between energy levels, and finally change populations of electrons on different energy levels; and based on dependence between fluorescence emission intensity and an energy level state, it can be concluded that intensity of the fluorescence reflected by the NV centers is related to a size and the direction of the external magnetic field; and based on this, if an axial included angle between the external magnetic field and each of the NV centers remains unchanged, the intensity of the fluorescence reflected by the NV centers varies regularly with intensity of the magnetic field; based on a steady-state energy level transition equation, a change relationship between the intensity of the fluorescence reflected by the NV centers and the intensity of the magnetic field is obtained; and then the size of the external magnetic field can be estimated by measuring the intensity of the fluorescence, and then the current in the electrified conductor can be calculated.

3) The Measurement Method Combining the all-Optical Measurement Method and the Non-all-Optical Measurement Method Includes:

in order to accurately measure a large-current electrified conductor, estimating a size of a magnetic field at the magnetic-concentration air gap by using the all-optical measurement method; taking one estimated value $B_1$ of the magnetic field, and applying a reverse magnetic field $B_1$ at the magnetic-concentration air gap, where the magnetic field is used to weaken the original magnetic field at the magnetic-concentration air gap; and then accurately calculating a size of a weakened magnetic field $B_2$ by using the ODMR method, subtracting or adding the two magnetic fields based on whether a direction of the magnetic field $B_2$ changes, to obtain a magnetic field generated by the large-current electrified conductor at the magnetic-concentration air gap, and then calculating a current.

In the measurement method combining the all-optical measurement method and the non-all-optical measurement method, a method for applying the reverse magnetic field $B_1$ is as follows:

31) winding the periphery of the magnetic concentrator by a coil with a certain quantity of turns based on a feedback adjustment method;

32) calculating a current $I_1$ required to generate a magnetic field with a same size as the magnetic field $B_1$ in the coil based on the magnetic field $B_1$; and 33) applying the current $I_1$ to the coil to generate the reverse magnetic field $B_1$.

Preferably, a principle of calculating the current in the electrified conductor based on the external magnetic field is as follows:

because the magnetic field generated by the electrified conductor is small, which is not conducive to improving measurement accuracy, the magnetic field generated by the electrified conductor is concentrated and amplified by the magnetic concentrator, and $B_0$ of an amplified magnetic field and the current $I_0$ in the electrified conductor satisfy the following formula:

$$\oint^{S_1} B_0 dS = \oint^{S_2} \frac{\mu_c I_0}{2\pi R} dS \quad (3)$$

where $B_0$ represents magnetic induction intensity at the magnetic-concentration air gap, $\mu_c$ represents permeability of the magnetic concentrator, $I_0$ represents the current for electrifying the conductor, R represents a distance between a magnetizer and the electrified conductor, $S_1$ represents cross-sectional area of the air gap of the magnetic concentrator, and $S_2$ represents maximum cross-sectional area of the magnetic concentrator; and $B_0$ of the magnetic field can be measured by using the NV centers, and then $I_0$ can be speculated according to the above formula.

Compared with the prior art, the present disclosure has the following beneficial effects.

1. Compared with the prior art, a sensor in the present disclosure has a simple structure and a low cost, and can be easily generalized.

2. Compared with the prior art, the optical fiber in the present disclosure is only used to transmit excitation light and collect fluorescence. Therefore, bending, distortion, and a length of the optical fiber do not affect a detection result to a certain extent, in other words, the optical fiber has low dependence on a material and can be used more conveniently.

3. Compared with the prior art, a fluorescence excitation and collection system, an analysis and processing system, and a sensing system in the present disclosure are independent of each other, which is convenient for system replacement or upgrade.

4. The present disclosure can also optimize concentrations and spin properties of the NV centers in the diamond to improve sensitivity of magnetic field measurement significantly, thereby providing a possibility for higher-precision current measurement.

BRIEF DESCRIPTION OF THE DRAWINGS

In order to describe the technical solutions in the embodiments of the present disclosure more clearly, the accompanying drawings required for describing the embodiments are briefly described below. Obviously, the accompanying drawings in the following description show merely some embodiments of the present disclosure, and a person of ordinary skill in the art would also be able to derive other accompanying drawings from these accompanying drawings without creative efforts.

Figure 1:
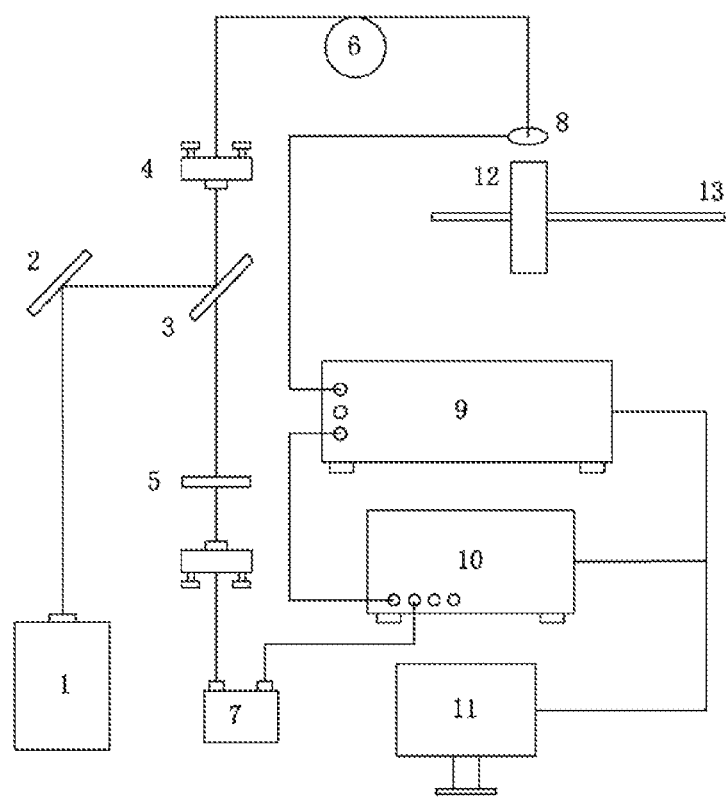
FIG. 1 is a schematic view showing an overall system of a fiber-optic current transformer according to the present disclosure.

Reference numerals: 1: laser; 2: reflector; 3: dichroic mirror; 4: fiber-optic coupler; 5: filter; 6: optical fiber; 7: photodetector; 8: microwave antenna; 9: microwave source; 10: fluorescence analysis processor; 11: computer; 12: magnetic concentrator; 13 electrified conductor; 14: diamond; 61: fiber core; 62: fiber-optic ceramic ferrule; 63: insulating cuticle.

DETAILED DESCRIPTION OF THE INVENTION

The technical solutions in the embodiments of the present disclosure will be described below clearly and completely with reference to the accompanying drawings in the embodiments of the present disclosure. Apparently, the described embodiments are merely some rather than all of the embodiments of the present disclosure. All other embodiments obtained by a person of ordinary skill in the art on the basis of the embodiments of the present disclosure without creative efforts shall fall within the protection scope of the present disclosure.

Figure 3:
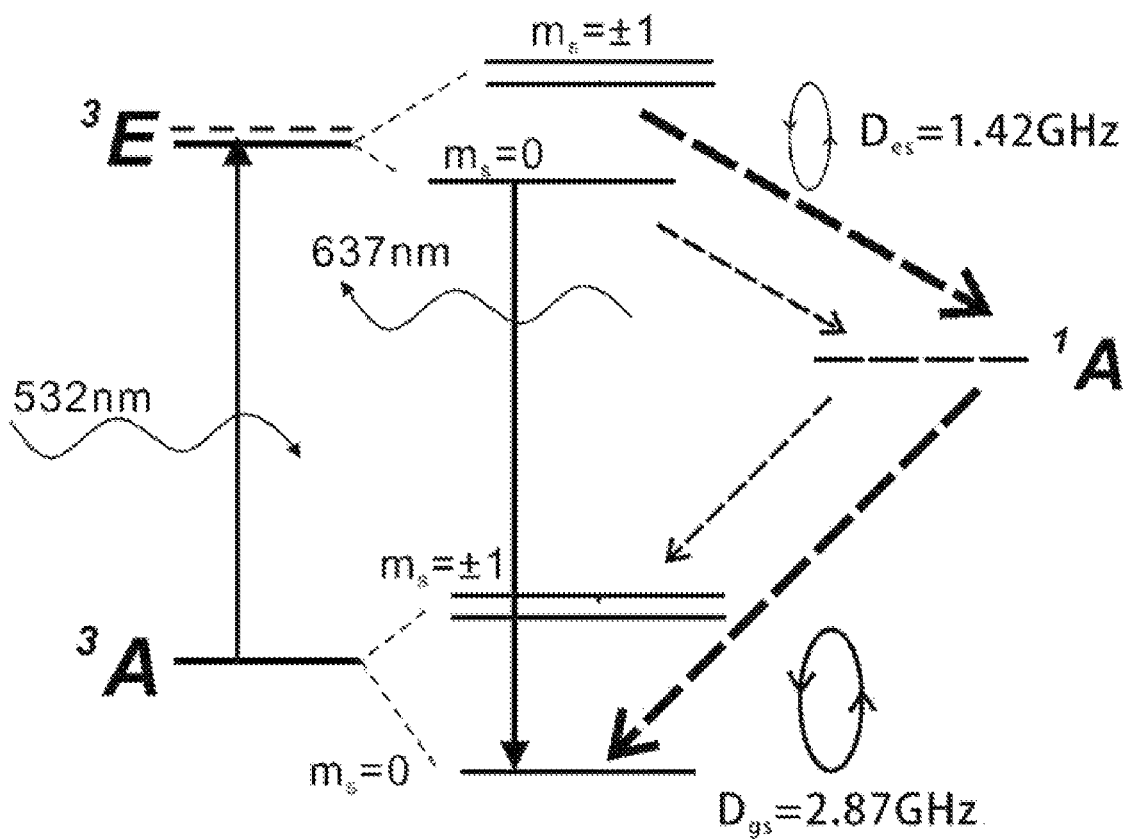
FIG. 3 shows energy levels of NV centers in diamond according to the present disclosure.

The NV centers in the diamond in the background art are luminous point defects in the diamond. A point defect in which a nitrogen atom replaces a carbon atom in the diamond and there is a hole in an adjacent position is referred to as an NV center. The NV center has a C3v symmetric structure and its symmetry axis is on a connection line between the nitrogen atom and a vacancy. The NV center can be understood as an artificial atom because it has a stable energy level structure, as shown in FIG. 3. When there is no external magnetic field, a ground-state energy level of the NV color center is a triplet state, mainly including a singlet state $|m_s=0\rangle$ and a doublet state $|m_s=\pm 1\rangle$. An energy level difference between the two quantum states is a value of a zero-field splitting $D_{gs}$, namely, 2.87 GHz, which changes with temperature and almost satisfies the following linear relationship at room temperature: $dD_{gs}/dT \approx 74$ KHz/K. However, if there is an external magnetic field, a Zeeman splitting occurs in this doublet state, and a splitting value is directly proportional to a magnetic field parallel to an axial direction of the NV center. After being excited by 532 nm laser light, a center in the $|m_s=\pm 1\rangle$ state transitions to a metastable state without radiation, and then returns to a ground state. A transition rate in this process is lower than $|m_s=0\rangle$. Therefore, photons emitted per unit time decrease, which makes it possible to read an electron spin state of the center based on an intensity change of spontaneous emission fluorescence. If continuous laser light is applied and microwave frequency sweeping is performed, an ODMR spectrum can be obtained.

For diamond with high-concentration NV centers, the centers interact with each other. Therefore, due to internal stress of the diamond, the centers are split in the doublet state even in a zero magnetic field. Moreover, a geomagnetic field always exists. Therefore, the ODMR spectrum has two peaks. If a direction of an applied external magnetic field is a lattice orientation [100] of the diamond, the ODMR spectrum also has two peaks. A size of the external magnetic field can be determined by measuring a resonance frequency corresponding to the two peaks.

In addition, the magnetic field not only affects ODMR spectrums of the NV centers, but also affects fluorescence emission intensity of the NV centers. Especially for an ensemble NV center, if the direction of the external magnetic field is parallel to the lattice orientation [100] of the diamond, fluorescence intensity changes monotonously with the magnetic field. Similarly, an approximate range of the magnetic field can be estimated based on the fluorescence intensity, and then ODMR detection can be carried out by adjusting a microwave scanning range, which reduces detection time and improves detection efficiency, especially in the case of a strong magnetic field. The above is magnetic field detection based on the NV centers, which provides an idea and a method for subsequent current detection. Traditional current detection is mostly realized by using an ammeter and other instruments, and has high detection accuracy.

Based on the above ideas, embodiments of the present disclosure provide a fiber-optic current transformer based on NV centers in diamond, and a measurement method. For details, reference may be made to the following embodiments.

Embodiment 1

Figure 2:
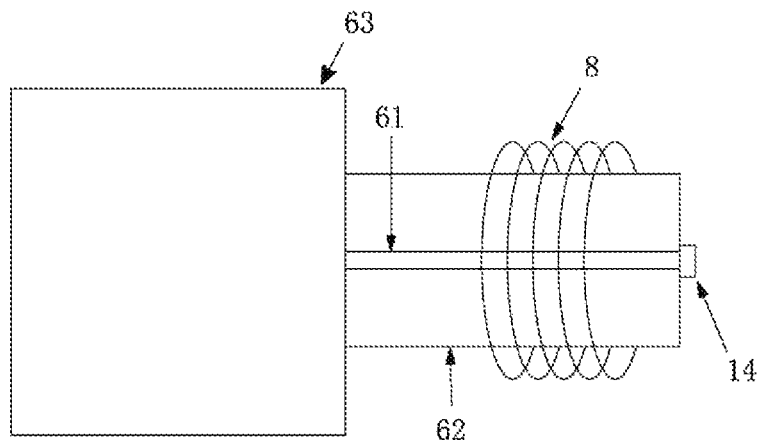
FIG. 2 is a schematic structural diagram of a diamond NV center probe according to the present disclosure.

As shown in FIG. 1 and FIG. 2, the present disclosure provides a new fiber-optic current transformer.

The fiber-optic current transformer includes a device for laser light excitation and reflected light reception and analysis, a diamond NV center probe, a magnetic concentrator, and a microwave excitation device.

The device for laser light excitation and reflected light reception and analysis is configured to excite a laser beam to the diamond NV center probe, screen a mixed laser beam reflected by the diamond NV center probe, and perform data analysis on retained fluorescence reflected by NV centers. Preferably, the device for laser light excitation and reflected light reception and analysis includes a laser 1, a reflector 2, a dichroic mirror 3, a fiber-optic coupler 4, a filter 5, an optical fiber 6, a photodetector 7, a fluorescence analysis processor 10, and a computer 11. The laser 1 emits the original laser beam, namely, 532 nm laser light, towards the reflector 2, and the reflected original laser beam is reflected secondarily by the dichroic mirror 3, enters the optical fiber 6 after being coupled by one fiber-optic coupler 4, and finally enters the diamond NV center probe. The diamond NV center probe generates reflected fluorescence after being irradiated by the original laser beam, and the reflected fluorescence and the original laser beam form the mixed laser beam. The mixed laser beam returns along the optical fiber 6 and is filtered by the dichroic mirror 3, the reflected fluorescence in the mixed laser beam penetrates the dichroic mirror 3, and the reflected fluorescence penetrating the dichroic mirror 3 undergoes secondary filtering by the filter 5 to obtain detection fluorescence. The obtained detection fluorescence is coupled by another fiber-optic coupler 4 and enters another optical fiber connected to the photodetector 7. The photodetector 7 detects the detection fluorescence and transmits detection data to the fluorescence analysis processor 10 for signal analysis and processing. The photodetector 7 is an avalanche diode or a photodiode, and the fluorescence analysis processor 10 is a phase-locked amplifier.

The diamond NV center probe is disposed at an original laser beam output terminal of the device for laser light excitation and reflected light reception and analysis, and configured to receive and reflect the original laser beam to generate the mixed laser beam. Preferably, the diamond NV center probe includes diamond 14 with high-concentration NV centers. The diamond is grown by using a chemical vapor deposition method. In the growth period, nitrogen is used as a doped gas source, and then annealing treatment at 800° C. is performed, such that the diamond contains the high-concentration NV centers (with content being about 0.15 ppm). After that, the diamond is cut and polished into 200*200*100 um block diamond samples. The diamond is disposed in the middle of an end face of the optical fiber 6 through welding or bonding. Preferably, the optical fiber 6 is a multimode optical fiber, including an internal fiber core 61 with a diameter of 100 um. A fiber-optic ceramic ferrule 62 with a diameter of 2.4 mm is disposed in a periphery of the fiber core 61, and a periphery of the fiber-optic ceramic ferrule 62 is covered with an insulating cuticle 63. The diamond 14 is disposed on an end portion of the optical fiber 6 and is in contact with the fiber core 61, and the insulating cuticle 63 on a side, close to the diamond 14, of the optical fiber 6 is removed, as shown in FIG. 2.

Figure 4:
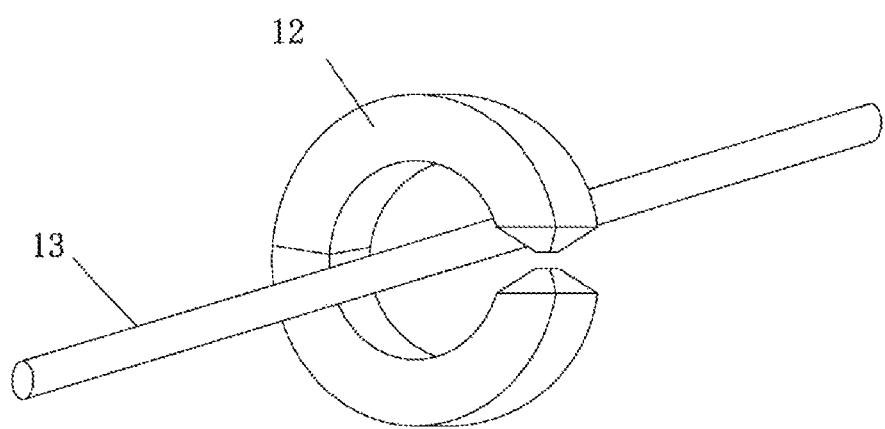
FIG. 4 is a schematic diagram showing a magnetic concentrator and a detection position of an electrified conductor according to the present disclosure.

The magnetic concentrator is placed in a periphery of a to-be-measured electrified conductor to increase a magnetic field in the periphery of the to-be-measured electrified conductor. Preferably, the magnetic concentrator is an assembled C-type magnetic concentration ring, which is spliced by two parts and can be disassembled before being used. When an electrified conductor 13 is tested, the two parts are spliced such that an electrified cable is located in the middle of the magnetic concentrator to strengthen a magnetic field around the electrified cable, as shown in FIG. 4.

A microwave excitation part of the microwave excitation device surrounds a periphery of the diamond NV center probe or a periphery of the magnetic concentrator to perform microwave frequency sweeping. Preferably, the microwave excitation device includes a microwave antenna 8 and a microwave source 9. The microwave antenna 8 is a 0.5 mm copper wire that is wrapped for 5 turns in the periphery of the diamond NV center probe or the periphery of the magnetic concentrator. The microwave source 9 generates an amplitude modulated microwave that can modulate the fluorescence emitted by the NV centers, the fluorescence is received by the photodetector 7 and finally used as an input signal of the fluorescence analysis processor 10, and an RF signal output by the microwave source 9 is used as a reference signal of the fluorescence analysis processor 10. After that, an amplitude modulated ODMR spectrum can be obtained by sweeping a microwave frequency and recording an output signal of the fluorescence analysis processor 10. A current can be speculated by obtaining a resonance frequency of the ODMR spectrum through fitting and detection.

Embodiment 2

Based on Embodiment 1, this embodiment specifically describes a non-all-optical measurement method based on the above fiber-optic current transformer. The non-all-optical measurement method has higher sensitivity but a smaller dynamic measurement range, and is suitable for measuring a small-current conductor.

During a measurement, the magnetic concentrator 12 is placed in a periphery of a to-be-measured electrified conductor 13. The diamond NV center probe is placed in a magnetic-concentration air gap (namely, a C-type ring fracture in FIG. 4) of the magnetic concentrator 12, and a lattice orientation [100] of the diamond 14 is made parallel to a magnetic field in the magnetic-concentration air gap. The device for laser light excitation and reflected light reception and analysis emits an original laser beam, and the original laser light is used to irradiate the diamond 14. The microwave source 9 is started at the same time to generate a modulated microwave, and an RF with a same modulation frequency is used as a reference signal of the fluorescence analysis processor 10. The modulated microwave is used to perform frequency sweeping on fluorescence emitted by the NV centers, to obtain an ODMR spectrum. A size of an external magnetic field is accurately calculated by using an ODMR method, and then a current in the electrified conductor is calculated.

In the non-all-optical measurement method, a principle of the ODMR method is as follows:

Considering that a magnetic field B and a microwave $\Omega \cos(2\pi ft)$ that interact with each other exist in peripheries of the NV centers, impact of internal stress of an ensemble center is ignored, and ground-state Hamiltonians of the NV centers are:

$$H = D(t)S_z^2 + B_z S_z + B_x S_x + B_y S_y + \Omega \cos(2\pi ft) S_x \quad (1)$$

where Z represents an axial direction of each of the NV centers, $B_x$, $B_y$, and $B_z$ represent projection sizes of a magnetic field vector $\vec{B}$ in x, y, and z directions respectively, $S_x$, $S_y$, and $S_z$ represent projection sizes of a spin operator $\vec{S}$ in the x, y, and z directions respectively, $\Omega$ represents a value of microwave power, f represents a microwave frequency, and D(T) represents a value of a zero-field splitting of each of the NV centers at temperature T.

Figure 5:
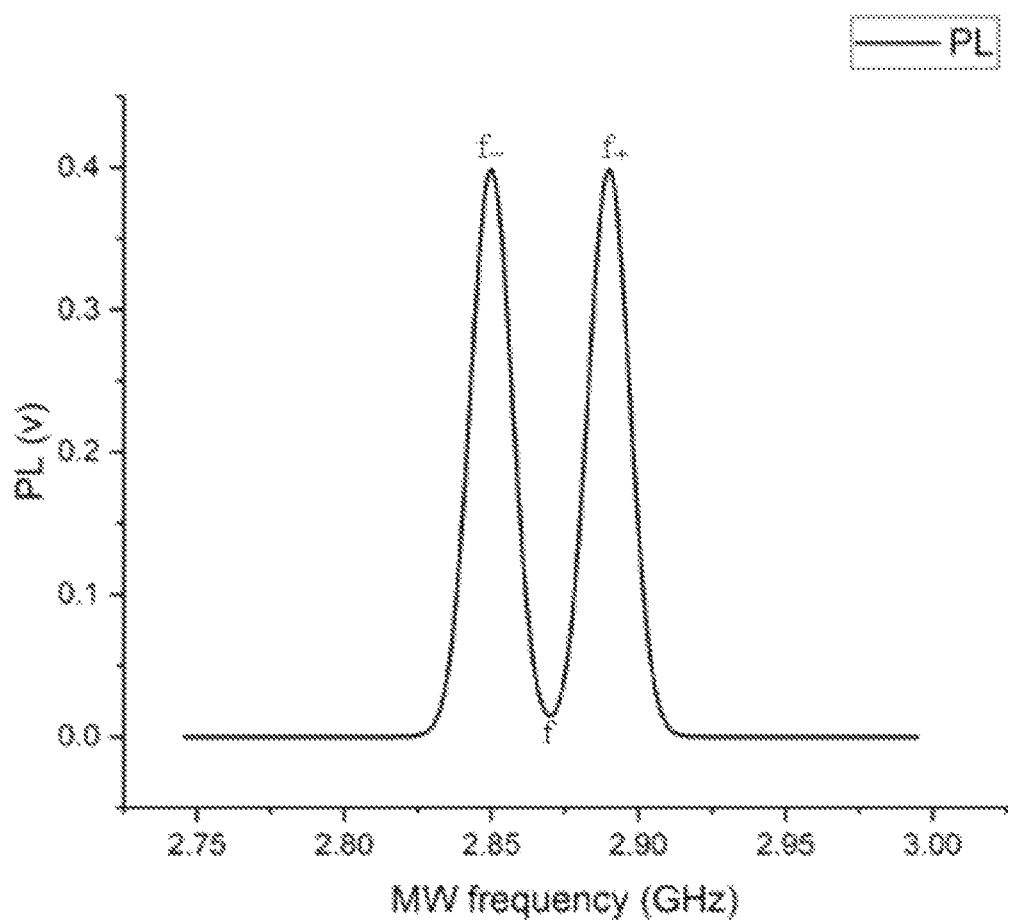
FIG. 5 shows an ODMR spectral line detected by using an amplitude modulated microwave according to the present disclosure.

During detection, the lattice orientation [100] of the diamond is made parallel to the applied magnetic field B, and in this case, the ODMR spectrum can be obtained based on a decoherence principle of the NV centers and a Lindblad master equation, as shown in FIG. 5. The ODMR spectrum satisfies the following relational expression:

$$S_{cw}(f) = 1 - \frac{C\gamma}{(f - f_-)^2 + \gamma^2} - \frac{C\gamma}{(f - f_+)^2 + \gamma^2} \quad (2)$$

where C and $\gamma$ represent a contrast and an FWHM of a spectral line respectively, f− represents a center frequency of a left peak of the ODMR spectrum, f+ represents a center frequency of a right peak of the ODMR spectrum, and f represents a center frequency of a valley between two peaks of the ODMR spectrum.

A size of the external magnetic field B can be speculated by fitting and measuring a resonance frequency corresponding to the two peaks in the ODMR spectrum.

When the magnetic concentrator surrounds the electrified conductor, $B_0$ of a magnetic field generated at the magnetic-concentration air gap of the magnetic concentrator and the current $I_0$ in the electrified conductor satisfy the following relationship:

$$\oint^{S_1} B_0 dS = \oint^{S_2} \frac{\mu_c I_0}{2\pi R} dS \quad (3)$$

where $B_0$ represents magnetic induction intensity at the magnetic-concentration air gap, $\mu_c$ represents permeability of the magnetic concentrator, $I_0$ represents the current for electrifying the conductor, R represents a distance between a magnetizer and the electrified conductor, $S_1$ represents cross-sectional area of the air gap of the magnetic concentrator, and $S_2$ represents maximum cross-sectional area of the magnetic concentrator.

$B_0$ of the magnetic field can be measured by using the ODMR spectrum, and then $I_0$ can be speculated according to the above formula.

Embodiment 3

Based on Embodiment 1, this embodiment specifically describes an all-optical measurement method based on the above fiber-optic current transformer. The all-optical measurement method has a larger dynamic measurement range but lower sensitivity, and is suitable for measuring a large-current conductor.

During a measurement, the magnetic concentrator is placed in a periphery of a to-be-measured electrified conductor. The diamond NV center probe is placed in a magnetic-concentration air gap of the magnetic concentrator, and a lattice orientation [100] of the diamond 14 is made parallel to a magnetic field in the magnetic-concentration air gap. The device for laser light excitation and reflected light reception and analysis emits an original laser beam, and the original laser light is used to irradiate the diamond 14. Fluorescence reflected by the diamond 14 is returned to the device for laser light excitation and reflected light reception and analysis. A size of an external magnetic field is estimated by analyzing the reflected fluorescence, and then a current in the conductor is calculated.

A Principle of the all-Optical Measurement Method is as Follows:

Considering that there is no magnetic field in peripheries of the NV centers, a transition rate between a ground state and an excited state of a system satisfies a transition rate equation for an electron energy level, namely:

$$k^0 = \{k_r^0, k_{57}^0, k_{67}^0, k_{47}^0, k_{71}^0, k_{72}^0, k_{73}^0\} \quad (4);$$

When there is a magnetic field in the peripheries of the NV centers, and if a direction of the magnetic field is not parallel to axial directions of the NV centers, the external magnetic field changes energy-level eigenstates of the NV centers, so as to change a transition rate between energy levels. In other words, the following formula is satisfied:

$$k = k^0(B, \theta) \quad (5)$$

where B represents a size of the magnetic field, and θ represents an axial included angle between the magnetic field and each of the NV centers.

Finally, populations of electrons on different energy levels are changed, and based on dependence between fluorescence emission intensity and an energy level state, it can be concluded that intensity of the fluorescence reflected by the NV centers is related to the size and the direction of the external magnetic field.

Figure 6:
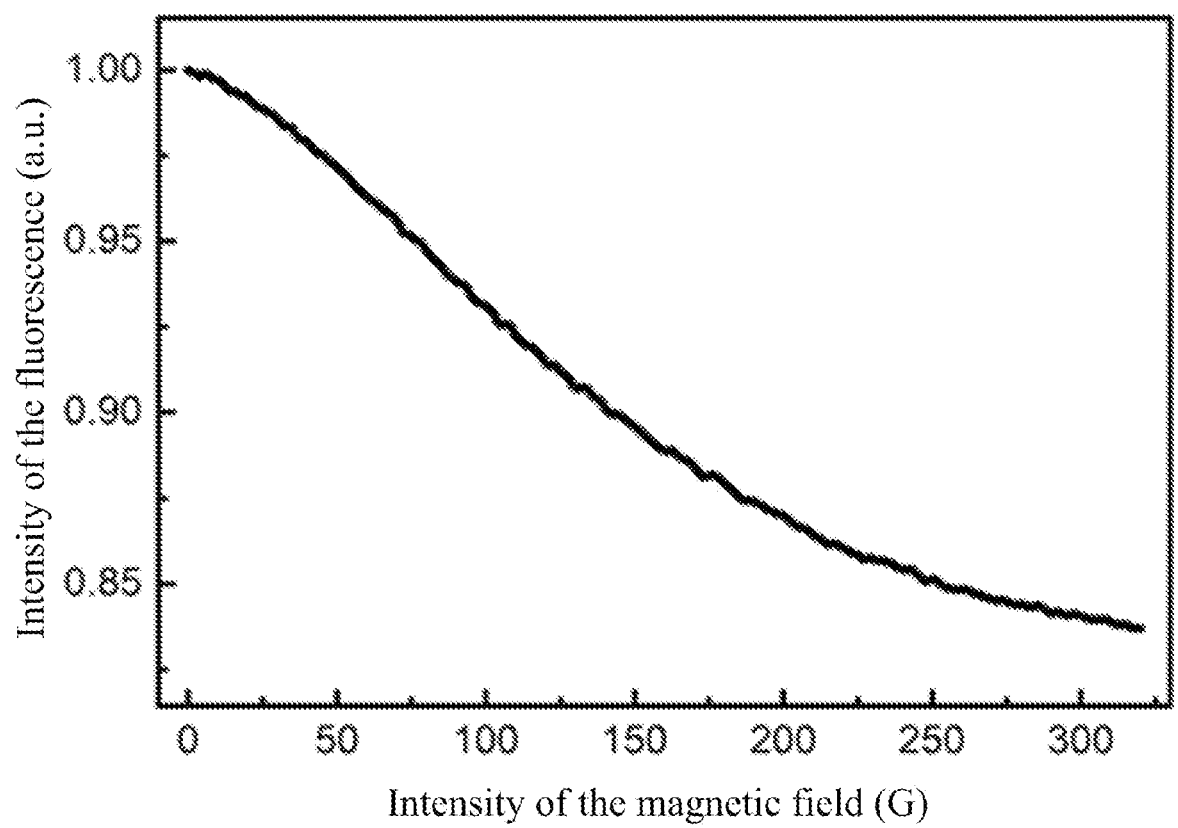
FIG. 6 shows a relationship between fluorescence intensity and an external magnetic field when the magnetic field is measured by using an all-optical method according to the present disclosure.

Based on this, if the axial included angle between the external magnetic field and each of the NV centers remains unchanged, the intensity of the fluorescence reflected by the NV centers varies regularly with intensity of the magnetic field, as shown in FIG. 6 (a vertical axis represents the intensity of the fluorescence and a horizontal axis represents the intensity of the external magnetic field). Based on a steady-state energy level transition equation, a change relationship between the intensity of the fluorescence reflected by the NV centers and the intensity of the magnetic field is obtained. Then the size of the external magnetic field can be estimated by measuring the intensity I(B) of the fluorescence, and then the current in the electrified conductor is calculated. A relational expression between the intensity I(B) of the fluorescence and the intensity of the magnetic field is as follows:

$$\frac{dn_i}{dt} = \sum_{i}^{7} (k_{ji} n_j - k_{ij} n_i) \quad (6)$$

$$I(B) = \sum_{i=4}^{6} \sum_{j=1}^{3} n_i k_{ij} \quad (7)$$

where $k_{ij}$ represents a rate of transition from energy level i to energy level j, $k_{ij}$ represents a rate of transition from energy level j to energy level i, $n_i$ represents a quantity of populations of the NV centers on energy level j, $n_j$ represents a quantity of populations of the NV centers on energy level j, and a value of i or j ranges from 0 to 7.

The intensity of the fluorescence can be detected by the fluorescence analysis processor. According to the above formula, the size of the external magnetic field can be estimated, and then the current in the electrified conductor can be calculated according to the above formula (3).

Embodiment 4

Based on Embodiment 2 and Embodiment 3, this embodiment describes a measurement method combining the all-optical measurement method and the non-all-optical measurement method. The measurement method combining the all-optical measurement method and the non-all-optical measurement method has a larger dynamic measurement range and higher sensitivity, and can measure a large-current electrified conductor more accurately.

In order to accurately measure the large-current electrified conductor, a size of a magnetic field at the magnetic-concentration air gap is estimated by using the all-optical measurement method. Then one estimated value $B_1$ of the magnetic field is taken, and a reverse magnetic field $B_1$ is applied at the magnetic-concentration air gap, where the magnetic field is used to weaken the original magnetic field at the magnetic-concentration air gap. After that, a size of a weakened magnetic field $B_2$ is accurately calculated by using the ODMR method, the two magnetic are subtracted or added based on whether a direction of the magnetic field $B_2$ changes, to obtain a magnetic field generated by the large-current electrified conductor at the magnetic-concentration air gap, and then a current in the large-current electrified conductor is calculated.

In the measurement method combining the all-optical measurement method and the non-all-optical measurement method, a method for applying the reverse magnetic field $B_1$ is as follows:

31) winding the periphery of the magnetic concentrator by a coil with a certain quantity of turns based on a feedback adjustment method;

32) calculating a current $I_1$ required to generate a magnetic field with a same size as the magnetic field $B_1$ in the coil based on the magnetic field $B_1$; and 33) applying the current $I_1$ to the coil to generate the reverse magnetic field $B_1$.

Furthermore, a quantum property of an ensemble NV center can be used to obtain extremely high temperature measurement sensitivity. The present disclosure can also be applied to micron-level temperature imaging, and can give full play to its application value in scientific research and industrial fields.

In the description of this specification, reference to terms "one embodiment", "examples", "specific examples", and the like means that a specific feature, structure, material or characteristic described in combination with the embodiment or example are included in at least one embodiment or example of the present disclosure. In this specification, the schematic descriptions of the above terms do not necessarily refer to the same embodiment or example. Moreover, the specific features, structures, materials or characteristics described may be combined in any suitable manner in any one or more embodiments or examples.

The preferred embodiments of the present disclosure disclosed above are only used to help illustrate the present disclosure. The preferred embodiments neither describe all the details in detail, nor limit the present disclosure to the specific implementations described. Obviously, a plurality of modifications and changes can be made according to the content of this specification. This specification selects and specifically describes these embodiments, in order to better explain the principle and practical application of the present disclosure, such that a person skilled in the art can well understand and use the present disclosure. The present disclosure is only limited by the claims, a full scope thereof and equivalents.

What is claimed is:

1. A fiber-optic current transformer based on nitrogen-vacancy (NV) centers in diamond, comprising: a device for laser light excitation and reflected light reception and analysis, a diamond NV center probe, a magnetic concentrator, and a microwave excitation device, wherein the device for laser light excitation and reflected light reception and analysis is configured to transmit laser light to the diamond NV center probe, screen a mixed laser beam reflected by the diamond NV center probe, and perform data analysis on retained fluorescence reflected by NV centers;

the diamond NV center probe is disposed at an original laser beam output terminal of the device for laser light excitation and reflected light reception and analysis, and configured to receive and reflect an original laser beam to generate the mixed laser beam;

the magnetic concentrator is disposed in a periphery of a to-be-measured electrified conductor, and configured to increase a magnetic field in the periphery of the to-be-measured electrified conductor; and a microwave excitation part of the microwave excitation device surrounds a periphery of the diamond NV center probe or a periphery of the magnetic concentrator to perform microwave frequency sweeping.

2. The fiber-optic current transformer based on NV centers in diamond according to claim 1, wherein the device for laser light excitation and reflected light reception and analysis comprises a laser, a reflector, a dichroic mirror, a fiber-optic coupler, a filter, an optical fiber, a photodetector, a fluorescence analysis processor, and a computer, wherein the laser emits the original laser beam towards the reflector, and the reflected original laser beam is reflected secondarily by the dichroic mirror, enters the optical fiber after being coupled by one fiber-optic coupler, and finally enters the diamond NV center probe; the diamond NV center probe generates reflected fluorescence after being irradiated by the original laser beam, and the reflected fluorescence and the original laser beam form the mixed laser beam; the mixed laser beam returns along the optical fiber and is filtered by the dichroic mirror, the reflected fluorescence in the mixed laser beam penetrates the dichroic mirror, and the reflected fluorescence penetrating the dichroic mirror undergoes secondary filtering by the filter to obtain detection fluorescence; the obtained detection fluorescence is coupled by another fiber-optic coupler and enters the optical fiber connected to the photodetector; and the photodetector detects the detection fluorescence and transmits detection data to the fluorescence analysis processor for signal analysis and processing.

3. The fiber-optic current transformer based on NV centers in diamond according to claim 2, wherein the diamond NV center probe comprises a diamond containing high-concentration NV centers, and the diamond is disposed in the middle of an end face of the optical fiber through welding or bonding.

4. The fiber-optic current transformer based on NV centers in diamond according to claim 2, wherein the photodetector is an avalanche diode or a photodiode, and the fluorescence analysis processor is a phase-locked amplifier.

5. The fiber-optic current transformer based on NV centers in diamond according to claim 2, wherein the microwave excitation device comprises a microwave antenna and a microwave source, wherein the microwave antenna is a coil surrounding the periphery of the diamond NV center probe or the periphery of the magnetic concentrator; and the microwave source generates an amplitude modulated microwave that can modulate the fluorescence emitted by the NV centers, the fluorescence is received by the photodetector and finally used as an input signal of the fluorescence analysis processor, and a radio frequency (RF) signal output by the microwave source is used as a reference signal of the fluorescence analysis processor.

6. A measurement method for the fiber-optic current transformer based on NV centers in diamond according to claim 1, comprising an all-optical measurement method, a non-all-optical measurement method, and a measurement method combining the all-optical measurement method and the non-all-optical measurement method, wherein 1) the all-optical measurement method comprises:
when measuring a large-current electrified conductor, placing the magnetic concentrator in a periphery of the to-be-measured electrified conductor; placing the diamond NV center probe in a magnetic-concentration air gap of the magnetic concentrator, and making a lattice orientation of the diamond parallel to a magnetic field in the magnetic-concentration air gap; emitting, by the device for laser light excitation and reflected light reception and analysis, an original laser beam, and using the original laser light to irradiate the diamond; returning, to the device for laser light excitation and reflected light reception and analysis, fluorescence reflected by the diamond; and estimating a size of an external magnetic field by analyzing an intensity change of the reflected fluorescence, and then calculating a current in the conductor;

2) the non-all-optical measurement method comprises:
when measuring a small-current electrified conductor, placing the magnetic concentrator in a periphery of the to-be-measured electrified conductor; placing the diamond NV center probe in the magnetic-concentration air gap of the magnetic concentrator, and making the lattice orientation of the diamond parallel to the magnetic field in the magnetic-concentration air gap; emitting, by the device for laser light excitation and reflected light reception and analysis, an original laser beam, and using the original laser light to irradiate the diamond; starting the microwave source at the same time to generate a modulated microwave, and using an RF with a same modulation frequency as a reference signal of the fluorescence analysis processor; performing, by using the modulated microwave, frequency sweeping on fluorescence emitted by the NV centers, to obtain an optically detected magnetic resonance (ODMR) spectrum; and accurately calculating a size of an external magnetic field by using an ODMR method, and then calculating a current in the electrified conductor; and 3) the measurement method combining the all-optical measurement method and the non-all-optical measurement method comprises:
in order to accurately measure a large-current electrified conductor, estimating a size of a magnetic field at the magnetic-concentration air gap by using the all-optical measurement method; taking one estimated value $B_1$ of the magnetic field, and applying a reverse magnetic field $B_1$ at the magnetic-concentration air gap, wherein the magnetic field is used to weaken the original magnetic field at the magnetic-concentration air gap; and then accurately calculating a size of a weakened magnetic field $B_2$ by using the ODMR method, subtracting or adding the two magnetic fields based on whether a direction of the magnetic field $B_2$ changes, to obtain a magnetic field generated by the large-current electrified conductor at the magnetic-concentration air gap, and then calculating a current.

7. The measurement method for the fiber-optic current transformer based on NV centers in diamond according to claim 6, wherein the device for laser light excitation and reflected light reception and analysis comprises a laser, a reflector, a dichroic mirror, a fiber-optic coupler, a filter, an optical fiber, a photodetector, a fluorescence analysis processor, and a computer, wherein the laser emits the original laser beam towards the reflector, and the reflected original laser beam is reflected secondarily by the dichroic mirror, enters the optical fiber after being coupled by one fiber-optic coupler, and finally enters the diamond NV center probe; the diamond NV center probe generates reflected fluorescence after being irradiated by the original laser beam, and the reflected fluorescence and the original laser beam form the mixed laser beam; the mixed laser beam returns along the optical fiber and is filtered by the dichroic mirror, the reflected fluorescence in the mixed laser beam penetrates the dichroic mirror, and the reflected fluorescence penetrating the dichroic mirror undergoes secondary filtering by the filter to obtain detection fluorescence; the obtained detection fluorescence is coupled by another fiber-optic coupler and enters the optical fiber connected to the photodetector; and the photodetector detects the detection fluorescence and transmits detection data to the fluorescence analysis processor for signal analysis and processing.

8. The measurement method for the fiber-optic current transformer based on NV centers in diamond according to claim 7, wherein the diamond NV center probe comprises a diamond containing high-concentration NV centers, and the diamond is disposed in the middle of an end face of the optical fiber through welding or bonding.

9. The measurement method for the fiber-optic current transformer based on NV centers in diamond according to claim 7, wherein the photodetector is an avalanche diode or a photodiode, and the fluorescence analysis processor is a phase-locked amplifier.

10. The measurement method for the fiber-optic current transformer based on NV centers in diamond according to claim 7, wherein the microwave excitation device comprises a microwave antenna and a microwave source, wherein the microwave antenna is a coil surrounding the periphery of the diamond NV center probe or the periphery of the magnetic concentrator; and the microwave source generates an amplitude modulated microwave that can modulate the fluorescence emitted by the NV centers, the fluorescence is received by the photodetector and finally used as an input signal of the fluorescence analysis processor, and a radio frequency (RF) signal output by the microwave source is used as a reference signal of the fluorescence analysis processor.

11. The measurement method for the fiber-optic current transformer based on NV centers in diamond according to claim 6, wherein in the non-all-optical measurement method, a principle of the ODMR method is as follows:
considering that a magnetic field B and a microwave $\Omega \cos(2\pi f t)$ that interact with each other exist in peripheries of the NV centers, impact of internal stress of an ensemble center is ignored, and ground-state Hamiltonians of the NV centers are:

$$H = D(t)S_z^2 + B_z S_z + B_x S_x + B_y S_y + \Omega \cos(2\pi f t) S_x \quad (1)$$

wherein Z represents an axial direction of each of the NV centers, $B_x$, $B_y$, and $B_z$ represent projection sizes of a magnetic field vector $\vec{B}$ in x, y, and z directions respectively, $S_x$, $S_y$, and $S_z$ represent projection sizes of a spin operator $\vec{S}$ in the x, y, and z directions respectively, $\Omega$ represents a value of microwave power, f represents a microwave frequency, and D(T) represents a value of a zero-field splitting of each of the NV centers at temperature T;

during detection, the lattice orientation of the diamond is made parallel to the applied magnetic field B, and in this case, the ODMR spectrum can be obtained based on a decoherence principle of the NV centers and a Lindblad master equation, and satisfies the following relational expression:

$$S_{cw}(f) = 1 - \frac{C\gamma}{(f - f_-)^2 + \gamma^2} - \frac{C\gamma}{(f - f_+)^2 + \gamma^2} \quad (2)$$

wherein C and γ represent a contrast and a full width at half maximum (FWHM) of a spectral line respectively, f− represents a center frequency of a left peak of the ODMR spectrum, f+ represents a center frequency of a right peak of the ODMR spectrum, and f represents a center frequency of a valley between two peaks of the ODMR spectrum; and
a size of the external magnetic field B can be speculated by measuring a resonance frequency corresponding to the two peaks in the ODMR spectrum, and then the current in the electrified conductor is calculated.

12. The measurement method for the fiber-optic current transformer based on NV centers in diamond according to claim 6, wherein a principle of the all-optical measurement method is as follows:
considering that there is no magnetic field in peripheries of the NV centers, a transition rate between a ground state and an excited state of a system satisfies a transition rate equation for an electron energy level;
when there is a magnetic field in the peripheries of the NV centers, and if a direction of the magnetic field is not parallel to axial directions of the NV centers, the external magnetic field changes energy-level eigenstates of the NV centers, so as to change a transition rate between energy levels, and finally change populations of electrons on different energy levels; and based on dependence between fluorescence emission intensity and an energy level state, it can be concluded that intensity of the fluorescence reflected by the NV centers is related to a size and the direction of the external magnetic field; and
based on this, if an axial included angle between the external magnetic field and each of the NV centers remains unchanged, the intensity of the fluorescence reflected by the NV centers varies regularly with intensity of the magnetic field; based on a steady-state energy level transition equation, a change relationship between the intensity of the fluorescence reflected by the NV centers and the intensity of the magnetic field is obtained; and then the size of the external magnetic field can be estimated by measuring the intensity of the fluorescence, and then the current in the electrified conductor can be calculated.

13. The measurement method for the fiber-optic current transformer based on NV centers in diamond according to claim 6, wherein in the measurement method combining the all-optical measurement method and the non-all-optical measurement method, a method for applying the reverse magnetic field $B_1$ is as follows:
31) winding the periphery of the magnetic concentrator by a coil with a certain quantity of turns based on a feedback adjustment method;
32) calculating a current $I_1$ required to generate a magnetic field with a same size as the magnetic field $B_1$ in the coil based on the magnetic field $B_1$; and 33) applying the current $I_1$ to the coil to generate the reverse magnetic field $B_1$.

14. The measurement method for the fiber-optic current transformer based on NV centers in diamond according to claim 11, wherein a principle of calculating the current in the electrified conductor based on the external magnetic field is as follows:

because the magnetic field generated by the electrified conductor is small, which is not conducive to improving measurement accuracy, the magnetic field generated by the electrified conductor is concentrated and amplified by the magnetic concentrator, and $B_0$ of an amplified magnetic field and the current $I_0$ in the electrified conductor satisfy the following formula:

$$\oint^{S_1} B_0 dS = \oint^{S_2} \frac{u_c I_0}{2\pi R} dS \quad (3)$$

wherein $B_0$ represents magnetic induction intensity at the magnetic-concentration air gap, $\mu_c$ represents permeability of the magnetic concentrator, $I_0$ represents the current for electrifying the conductor, R represents a distance between a magnetizer and the electrified conductor, $S_1$ represents cross-sectional area of the air gap of the magnetic concentrator, and $S_2$ represents maximum cross-sectional area of the magnetic concentrator; and $B_0$ of the magnetic field can be measured by using the NV centers, and then $I_0$ can be speculated according to the above formula.

15. The measurement method for the fiber-optic current transformer based on NV centers in diamond according to claim 12, wherein a principle of calculating the current in the electrified conductor based on the external magnetic field is as follows:

because the magnetic field generated by the electrified conductor is small, which is not conducive to improving measurement accuracy, the magnetic field generated by the electrified conductor is concentrated and amplified by the magnetic concentrator, and $B_0$ of an amplified magnetic field and the current $I_0$ in the electrified conductor satisfy the following formula:

$$\oint^{S_1} B_0 dS = \oint^{S_2} \frac{u_c I_0}{2\pi R} dS \quad (3)$$

wherein $B_0$ represents magnetic induction intensity at the magnetic-concentration air gap, $\mu_c$ represents permeability of the magnetic concentrator, $I_0$ represents the current for electrifying the conductor, R represents a distance between a magnetizer and the electrified conductor, $S_1$ represents cross-sectional area of the air gap of the magnetic concentrator, and $S_2$ represents maximum cross-sectional area of the magnetic concentrator; and $B_0$ of the magnetic field can be measured by using the NV centers, and then $I_0$ can be speculated according to the above formula.

16. The measurement method for the fiber-optic current transformer based on NV centers in diamond according to claim 13, wherein a principle of calculating the current in the electrified conductor based on the external magnetic field is as follows:

because the magnetic field generated by the electrified conductor is small, which is not conducive to improving measurement accuracy, the magnetic field generated by the electrified conductor is concentrated and amplified by the magnetic concentrator, and $B_0$ of an amplified magnetic field and the current $I_0$ in the electrified conductor satisfy the following formula:

$$\oint^{S_1} B_0 dS = \oint^{S_2} \frac{u_c I_0}{2\pi R} dS \quad (3)$$

wherein $B_0$ represents magnetic induction intensity at the magnetic-concentration air gap, $\mu_c$ represents permeability of the magnetic concentrator, $I_0$ represents the current for electrifying the conductor, R represents a distance between a magnetizer and the electrified conductor, $S_1$ represents cross-sectional area of the air gap of the magnetic concentrator, and $S_2$ represents maximum cross-sectional area of the magnetic concentrator; and $B_0$ of the magnetic field can be measured by using the NV centers, and then $I_0$ can be speculated according to the above formula.

* * * * *